United States Patent [19]

Chrysler et al.

[11] Patent Number: 4,765,397
[45] Date of Patent: Aug. 23, 1988

[54] IMMERSION COOLED CIRCUIT MODULE WITH IMPROVED FINS

[75] Inventors: Gregory M. Chrysler; Richard Chao-Fan Chu; Robert E. Simmons, all of Poughkeepsie, N.Y.

[73] Assignee: International Business Machines Corp., Armonk, N.Y.

[21] Appl. No.: 935,680

[22] Filed: Nov. 28, 1986

[51] Int. Cl.[4] ............................................. H01L 23/46
[52] U.S. Cl. ............................... 165/104.33; 165/146; 165/80.3; 165/80.4; 165/903; 361/384; 361/385
[58] Field of Search ................. 165/1.46, 104.33, 80.4, 165/80.3, 147, 903; 361/385, 384

[56] References Cited

U.S. PATENT DOCUMENTS

| | | | |
|---|---|---|---|
| 2,119,381 | 5/1938 | Cheeseman et al. | 165/146 |
| 2,406,551 | 8/1946 | Lucke | 165/147 |
| 4,103,737 | 8/1978 | Perkins | 165/146 |
| 4,442,475 | 4/1984 | Franklin et al. | 165/80.3 |

FOREIGN PATENT DOCUMENTS

| | | | |
|---|---|---|---|
| 34223 | 8/1981 | European Pat. Off. | 361/384 |
| 2635445 | 2/1978 | Fed. Rep. of Germany | 361/384 |

OTHER PUBLICATIONS

Antonetti et al, VW *Thermal Coupler,* IBM Technical Disclosure Bulletin, IBM Technical Disclosure Bulletin, vol. 21, No. 2, Jul. 1978, pp. 749,750.

*Primary Examiner*—Albert W. Davis, Jr.
*Attorney, Agent, or Firm*—W. S. Robertson

[57] ABSTRACT

A circuit module that contains a planar array of chips has an improved fin assembly that transfers heat to a liquid coolant that is circulated through the fins in a single pass so that there is a tendency for the upstream edge of the fins to run cold and the downstream edge to run hot. The module can be immersed in the coolant. A shroud on the fins confines the coolant flow to channels defined by the fins, the shroud, and the base of the fins. The fin assembly is constructed so that the coolant channels are narrowed as a function of the temperature of the liquid coolant. The narrowing channels increase the coolant velocity and thereby improves the heat transfer at what would otherwise become the hot end of the module. The coolant velocity is increased at the appropriate rate to maintain equal cooling along the direction of coolant flow. The narrowing channels can be combined with other techniques for improving heat transfer, and in one embodiment the fin assembly has sets of fins spaced that increase in density along the direction of coolant flow. The increased fin density constricts the channels and thereby increases the coolant velocity. Modules with this fin assembly can be stacked closely together in an enclosure for a processing component. The processing component can hold other heat producing circuit devices either downstream of the finned modules or in a parallel coolant path.

1 Claim, 3 Drawing Sheets

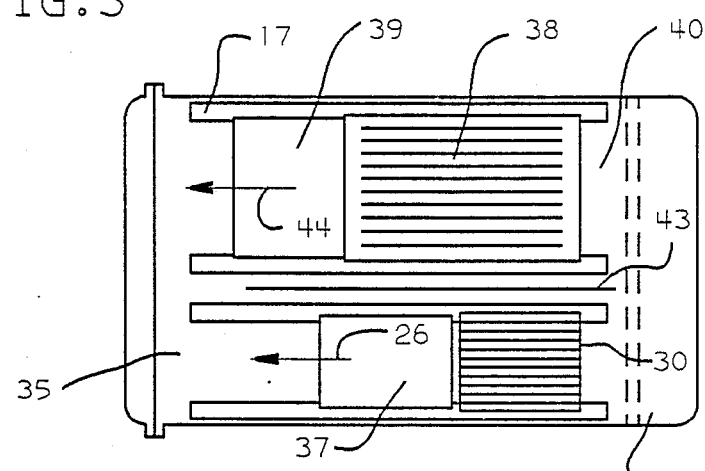
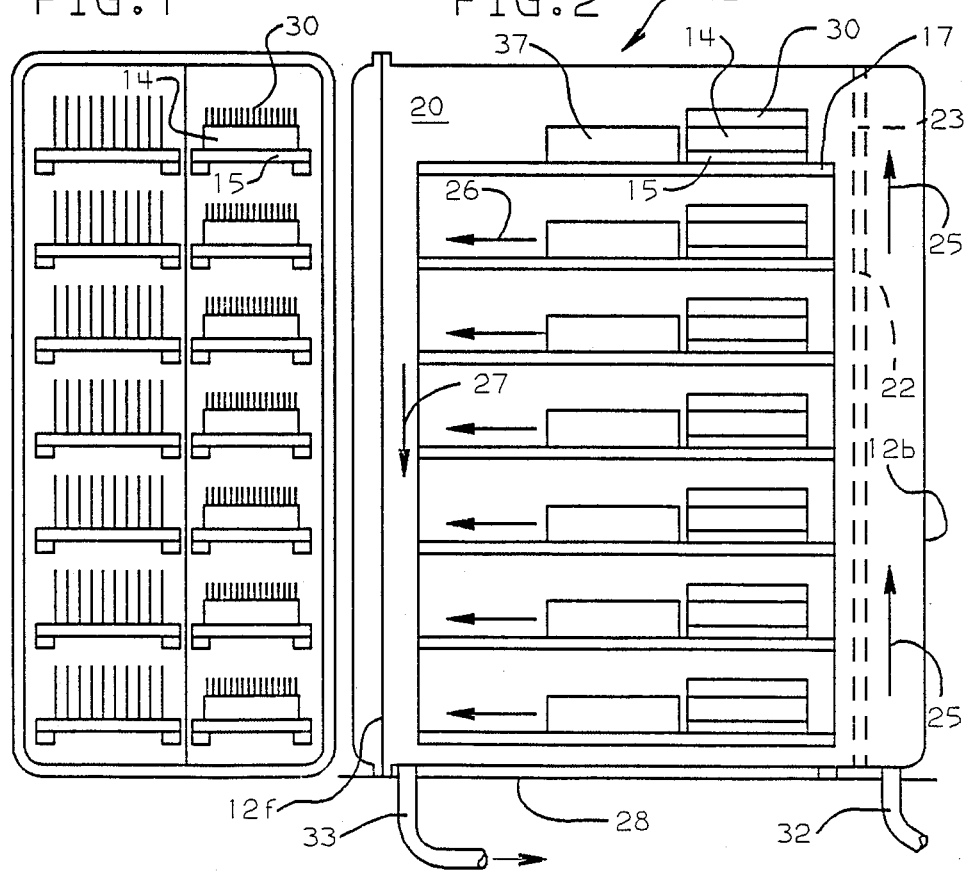

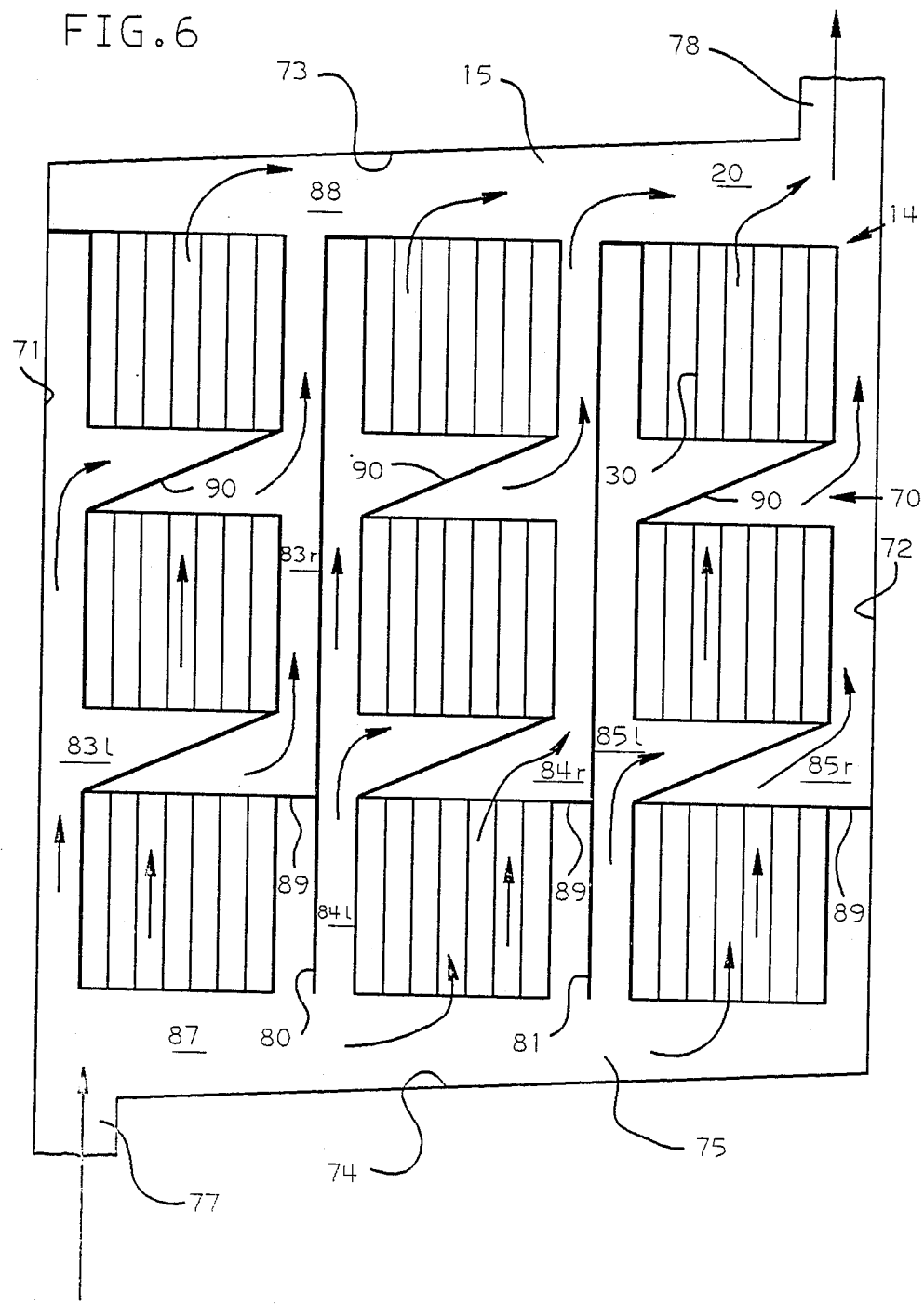

IMMERSION COOLED CIRCUIT MODULE WITH IMPROVED FINS

FIELD OF THE INVENTION

This invention relates to a semiconductor circuit module that is cooled by immersion in a dielectric liquid that is circulated through fins mounted on the circuit module.

INTRODUCTION

Although our invention will be useful with various circuit modules, the preferred embodiment is a modification of a circuit module that is called a thermal conduction module or TCM. TCM's are well known but it will be helpful to review the components and terminology that particularly apply to this invention. A TCM is shown for example in U.S. Pat. No. 3,993,123 to Chu, Gupta, Hwang and Simons.

As the term "module" suggests, a TCM is a repeating unit in a data processor. Several TCM's are mounted in a rectangular array on a circuit board, and an assembly of a board with TCM's will be called a "board assembly". One or more board assemblies and other components in a separate enclosure will be called a "processing component".

In this description of a conventional TCM it will be helpful to suppose that the board itself is mounted in a horizontal plane and to use the terms "upper" and "lower". (Conventionally the board is held inside a processor frame in a vertical plane.) A TCM has a chip carrier that has the shape of a thin square several inches on a side. Another name for the chip carrier is "substrate". Solder pads are located on the upper surface of the chip carrier, and the chips are electrically and mechanically connected to the pads in a row and column array. A hundred or so chips are mounted on the chip carrier. Connector pins extend from the lower surface of the chip carrier and plug into sockets on the board, and layers of conductor patterns inside the chip carrier form a conductive path between the pads and the connector pins.

A metal structure called a "hat" or "cap" fits over the chip carrier and the chips. A seal is formed at the rectangular edges of the chip carrier and the hat, and these components form an enclosure for the chips. The hat carries metal cylinders called pistons that are spring loaded to rest on the chips to conduct heat from the chips to the hat.

From a more general standpoint, a TCM is a circuit module that has a planar array of heat producing semiconductor devices and means for transferring heat from the devices in a direction orthogonal to the plane of the array to a heat conductive structure that forms part of the module. It will be convenient to keep the name "hat" for the heat transfer structure without regard to details of this part of the module. It will also simplify the description of the invention to define a coordinate system for this generalized structure. The plane of the heat producing array will be called the X-Y plane. The X and Y coordinates correspond to the rectangular edges of the chip carrier or the rows and columns of the array of chips. As will be explained later, a coolant flows along one of these dimensions. The direction from the array to the hat is designated the Z direction; it is also the direction of heat flow from the array.

The conventional components described so far are used in the preferred circuit module of this invention.

By contrast, an object of the invention is to eliminate another component of a conventional TCM: the cold plate. The cold plate is attached to the top of the hat, and heat is transferred from the hat to the cold plate. The cold plate has internal passages that carry chilled water that is supplied from a refrigeration system. A cold plate provides the advantageous heat transfer properties of water but physically isolates the chips and other electrical components from water. See Chu, U.S. Pat. No. 3,481,393.

Modules should be made as dense as possible because an electrical signal takes a significant amount of time to propagate between distant components. An object of this invention is to stack TCM circuit boards one above the other in a dense three dimensional array (or more generally, in the Z dimension).

In a three dimensional array of the conventional TCM structure, the cold plate would occupy a significant portion of the space between adjacent boards. The cold plates have hose connections to the chilled water system, and these connections require a significant amount of space above the hat. An object of the invention is to cool the TCM without a cold plate and to mount TCM boards in a close spacing that could not be achieved with a cold plate and the associated hoses.

While the above discussion emphasizes a three dimensional arrangement of TCM boards the invention is not limited to this approach. Equally valid from an application point of view is a dense X-Y array of TCM's.

THE PRIOR ART

The prior art has suggested cooling a circuit module by immersing it in a dielectric liquid, and the prior art has suggested substituting fins for the cold plate of a TCM. We have used both of these techniques in our new circuit module.

Some of the problems to be overcome with conventional immersion cooling can be understood by first comparing the fins of an immersion cooled TCM with a cold plate of a conventional TCM. Suppose that all of the chips of the two modules are the same: they each produce heat at the same rate and the cooling system must keep the junction temperatures for all of the transistors within a predetermined range. (Commonly, different chips operate at different power and the thermal path of the lower powered chips has been given increased resistance to prevent over cooling.)

Thus, the dielectric liquid flowing past the TCM fins must keep the hat at the same temperature as the hat of a TCM with a cold plate, and it must remove heat at the same rate as the chilled water flowing through the cold plate.

The heat capacity of a dielectric liquid is much less than the heat capacity of water; consequently, the dielectric liquid must be circulated through the fins at a rate that is proportionately higher than the rate at which water flows through a cold plate, as is well known. The dielectric liquid upstream of the finned TCM has a temperature that corresponds to the temperature of the chilled water at the inlet of a cold plate, and the dielectric liquid downstream of the finned TCM has a temperature that corresponds to the temperature of the chilled water at the outlet of a cold plate. (The corresponding temperatures are not necessarily equal, but other considerations limit the range of the inlet temperatures and the range of the outlet temperatures.)

To illustrate the effect of the cold plate, a side view of a TCM with a cold plate could be drawn with horizontal lines connecting points of equal temperature: a high temperature line running through the chips, a low temperature line running along the interface between the hat and the cold plate, and intermediate lines that are more or less horizontal. The cold plate itself has a more complex temperature distribution because chilled water enters at one point and warmed water leaves at another point. A top view of the TCM would show the array of chips at a more or less uniform temperature and the chilled water flowing in a serpentine path and having a particular temperature over each chip.

The temperature distribution within a cold plate is fairly uniform as compared with the temperature distribution within an equivalent set of fins, partly because the water flows through the cold plate in a serpentine path and partly because the metal mass of the cold plate helps to spread the heat laterally where lateral temperature gradients exist. Stated differently, the thermal resistance (explained later) is substantially the same for each chip position (until resistance is added for low power chips, as already explained.)

One object of our invention is to make the base of the fins as thin as possible for improved packaging density in the Z dimension. A normally conflicting object of our invention is to provide a new fin structure that achieves a more nearly uniform temperature between the inlet and outlet edges.

Our circuit package is also useful in a single planar array, and a specific embodiment will be described later.

SUMMARY OF THE INVENTION

Our immersion cooled TCM has a novel fin and shroud structure that causes the velocity of the cooling liquid to increase as the liquid flows through the channels between the fins. The flowrate of the dielectric liquid leaving the fins is the same as the flowrate entering the fins, and this flowrate is established by the cooling requirements of the TCM and the characteristics of the dielectric liquid, as already explained for a conventional immersion cooled circuit module.

Considered from a different standpoint, the velocity of the coolant at the cold end of the fins is less than the velocity at the hot end of the fins. This increase in velocity improves the heat transfer and thereby compensates for the rise in temperature of the coolant. The velocity is increased as a function of position in the upstream to downstream direction or, from a functional standpoint, as a function of the temperature rise. The thermal resistance is substantially the same for each chip position, as in the case of the cold plate.

In one embodiment of our invention, the fins are decreased in height in the downstream direction. This construction decreases the cross section of area in the path of flow and thereby increases the coolant velocity.

In a second embodiment of our invention, the fins are given a uniform height in the direction of coolant flow but additional fins are located downstream to reduce the cross section of area in the path of flow.

The second embodiment has the advantage that the fin area for heat transfer is increased. In the first embodiment the increase in velocity more than offsets the loss of fin area. In both embodiments a shroud confines the coolant within the volume of the fins.

THE DRAWING

FIG. 1 is a side view of an enclosure containing a dielectric liquid coolant and TCM's with the fin structure of this invention.

FIG. 2 is a front view of the enclosure of FIG. 1.

FIG. 3 is a top view of the enclosure of FIG. 1.

FIG. 6 is a top view of circuit packages of this invention in a planar array.

THE PREFERRED EMBODIMENT

The preferred processing component—FIGS. 1-3

Figure 4:
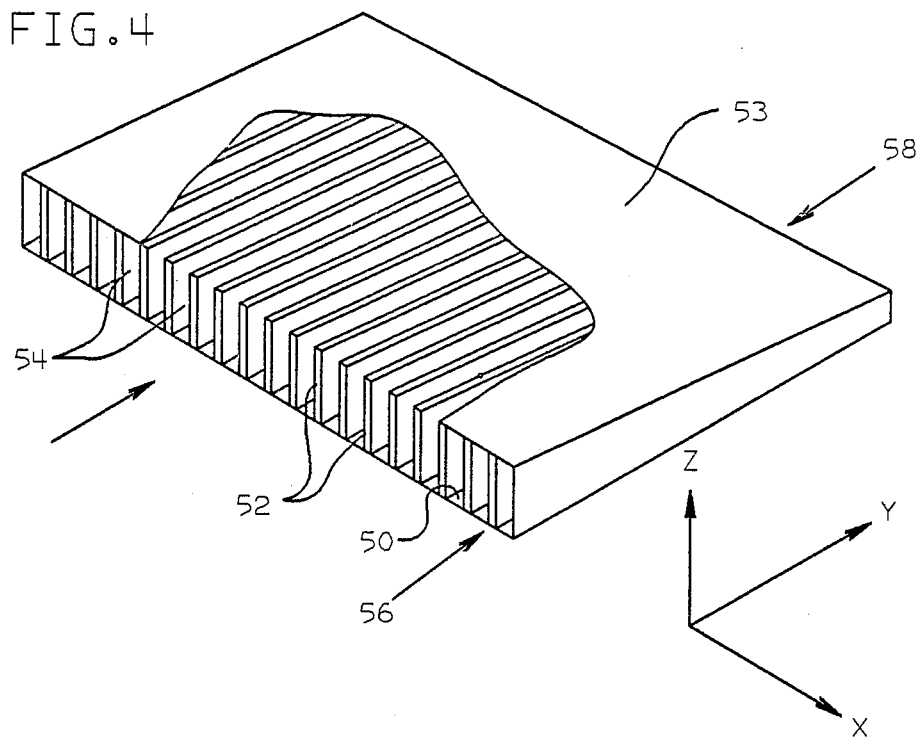
FIG. 4 is an isometric view of the fins and shroud of one embodiment of our invention.

These Figs. show an enclosure 12, TCM's 14 mounted on TCM circuit boards 15, a supporting structure 17 for holding the TCM boards in a vertical stack, the dielectric liquid coolant 20, and components 22-24 that direct the coolant to flow past the TCM's as shown by arrows 25-27. The preferred coolant is a non-boiling fluorocarbon. The enclosure is mounted on a conventional raised floor 28. These Figs. also show the fins 30 (without the shroud) in a schematic form that represents any of the fin assemblies that will be described later.

As FIG. 2 shows, the coolant enters the enclosure 12 at an inlet connection 32 and leaves at an outlet connection 33. The connections are located at the bottom of the enclosure so that the refrigeration apparatus (not shown) and/or the piping connections can be located under the raised floor. The refrigeration apparatus can be located an any convenient place and the connections can be suitably adapted. A baffle 22 cooperates with the back wall 12b of the enclosure to form a supply plenum 34, and apertures 23 are formed in the baffle to direct the coolant toward the TCM's. The components are spaced from the front wall 12f to form a return plenum 35 for the coolant. Suitable means not shown is provided for draining the coolant from the enclosure to access the enclosure for servicing. This structure will suggest a wide variety of means for distributing the coolant to the TCM's equally or on some other selected basis.

Preferably, other components are also located in the enclosure. Each TCM can have a power supply, and the top view of FIG. 3 shows a power supply 37 located downstream from the associated TCM. Storage components 38 and their power supplies 39 can be located in a space 40. An arrow 44 shows the coolant flow past components 38 and 39. This flow of the coolant is parallel to the flow 26 past the TCM's. A divider wall 43 separates space 40 from the stack of TCM's.

Alternative processing components

The top view of FIG. 3 shows a single TCM 14 on the topmost board 15, but from a more general standpoint, a TCM board 15 has an X-Y array of TCM's with one or more TCM's in each row and column of the array. In the orientation of FIG. 3, the columns extend vertically in the X dimension and the rows run horizontally in the Y dimension. If more than one TCM is positioned in a row or column, the means for distributing the coolant to the TCM's can have a suitable manifold system to connect each TCM to receive the coolant directly from the supply plenum 34. If more than one TCM in positioned in a single column of FIG. 3, (the Y dimension, across the direction of coolant flow), apertures 23 in baffle 22 can be arranged to supply an appropriate amount of coolant to each TCM.

The features described so far illustrate a wide variety of processing components that can use our invention.

The Fins and Shroud of FIG. 4

FIG. 4 shows a surface 50 of a base for fins 52. A shroud 53 cooperates with the fins 52 and base surface 50 to form channels 54 for carrying the coolant from the upstream edge 56 of the fins to the downstream edge 58. These components will be called a fin assembly. Preferably the base of the fin assembly is an integral part of the conventional hat structure of the TCM, but alternatively the fins can be formed on a separable base. From a more general standpoint, the fins are connected to the hat in a conductive heat transfer path. The fin assembly of FIG. 4 is open at the upstream end 56 and at the downstream end 58. Alternatively, the upstream edge of the fin assembly (and optionally the downstream edge) is closed by the wall of the manifold system. These general features of the fin assembly are conventional in other fin assemblies.

The channels 54 are larger in cross section at the upstream edge 56 than at the downstream edge 58. In the fin assembly of FIG. 4 this relationship is achieved by tapering the height of the fins in the downstream direction. Since the coolant is incompressible and is confined within the channels 54, the velocity of the coolant increases in the upstream to downstream direction. The effect of the velocity increase will be discussed next.

The cooling effect in FIG. 4

A familiar equation that describes heat transfer is $Q = \eta h A \Delta T$. Q is the rate of heat transfer in Watts. This value is established by the electrical power that is supplied to the module, and the temperature of the chips changes to achieve a value of $\Delta T$ that balances the equation (or some other term is actively controlled to maintain a predetermined chip temperature.) $\Delta T$ is the temperature difference that drives the heat transfer process, and in this example it is the temperature difference across the interface of the fin assembly and the coolant. The term h is a heat transfer coefficient that in this example includes the velocity of the coolant through the fin assembly. It also includes the properties of the fluid and the shape of the fins which are constant for this explanation. $\eta$ is a coefficient for the thermal efficiency of the fins. A is the area of the interface where the heat transfer takes place. In this analysis A is made small enough for the other terms to be substantially uniform throughout the area. Particular areas and the associated terms will be distinguished by numerical subscripts. Thus, $Q_1$ is the heat transfer rate for an incremental area $A_1$. The area of the entire fin assembly is the summation of all of the incremental A's, and the heat transfer rate for the entire fin assembly is the summation of all of the Q's.

Consider an area $A_1$ near the upstream edge 56 and area $A_2$ near the downstream edge 58. The temperature of the coolant at $A_2$ is necessarily higher than the coolant temperature at $A_1$ because heat is transferred to the coolant as it flows through the fin assembly. Since the fin assembly has a uniform surface temperature, the downstream coolant temperature difference $\Delta T_2$ is lower than the upstream coolant temperature difference $\Delta T_1$. The temperature difference decreases approximately linearly in the downstream direction. This introductory description applies to any fin structure, and it illustrates the problem of keeping the chips at a uniform temperature when the coolant temperature is higher for the downstream chips.

Tapering the fins has the effect of reducing the total area for heat transfer (the summation of the A's as a function of the upstream to downstream position) and thereby decreases the total heat transfer capacity in the downstream direction (the summation of the Q's as a function of the upstream to downstream position)—the opposite of the effect that is desired. Increasing the coolant velocity decreases the fin efficiency $\eta$ slightly. However, the increased coolant velocity is shown in the equation as an increase in the coefficient H. The increase in velocity can increase h fast enough (as a function of the upstream to downstream position) that the product $\eta h$ increases sufficiently to compensate for the loss of fin area. Thus, the temperature at the surface of the fin assembly is in fact uniform, as postulated at the beginning of this explanation, or it is at least sufficiently uniform to keep the chips operating within a predetermined temperature range.

Another familiar equation of heat transfer is $R = (\Delta T)/Q$. The fin geometry can be established by well known design procedures from the term R for each incremental area. The terms $\Delta T$ and Q are related to an incremental area, as in the first equation, except that in this situation, before the fins have been defined, the area is in a plane orthogonal to the direction of heat flow.

The temperature of the fins is uniform. The temperature of the coolant along the fins is known: it rises linearly from a selected initial value at the upstream edge of the fins to a selected final value at the downstream edge. Therefore, $\Delta T$ can be found for every incremental area as the difference between the temperature of the coolant and the temperature of the fins. Q is also uniform because the chips all have about the same power or because they are located on the substrate to produce approximately a uniform power per unit area of the substrate.

Figure 5:
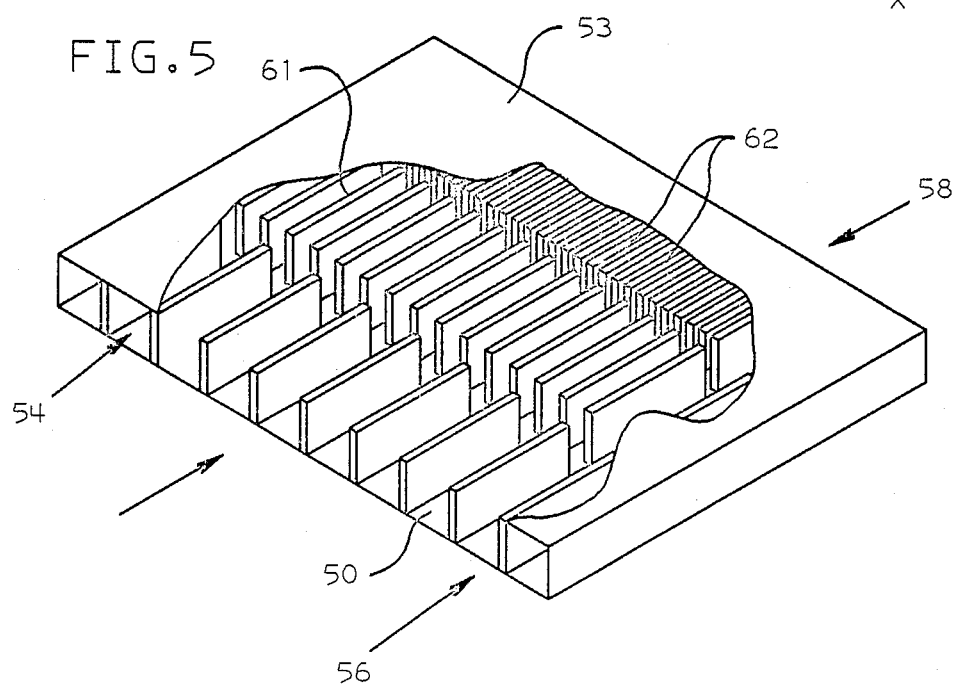
FIG. 5 is an isometric view of the fins and shroud of another embodiment of our invention.

The Fins and Shroud of FIG. 5

In FIG. 5, the base surface 50, shroud 53, and the upstream and downstream edges 56, 58 of the fin assembly, will be familiar from the description of FIG. 4. Unlike the fins 52 of FIG. 4, these fins are all the same height, and the channels are narrowed in the upstream to downstream direction by constructing the fins in several sets 60, 61, 62 that contain progressively more fins. With this construction the channels narrow discontinuously in contrast to the continuous narrowing in the fins of FIG. 4.

In the embodiment of FIG. 5, the fins of the less dense set 60 are aligned with but separate from some of the fins of the adjacent more dense set 61, and the fins of set 61 are aligned with but separate from some of the fins of the adjacent more dense set 62. Alternatively, the fins can be continuous from a less dense set and a more dense set or the fins can be separate and unaligned between adjacent sets, as is well known for fins of uniform density.

The cooling effect in FIG. 5

In FIG. 5, the increased number of fins in the downstream direction narrows the channels and thereby increases the coolant velocity. Increasing the coolant velocity increases h and decreases $\eta$, as already explained. Increasing the number of fins also increases the total area for heat transfer (the summation of the A's as a function of the upstream to downstream position) and thereby further improves the heat transfer in the downstream direction.

In the apparatus of FIG. 5 the area and the coolant velocity both increase in steps at each upstream edge of a row of fins. Within a row of fins, the temperature distribution is like the distribution for conventional fins that are uniform throughout their length, and the fins tend to be cooler at the upstream edge and hotter at the downstream edge. The rows are made short enough in the upstream to downstream direction so that the temperature remains within predetermined limits that are suitable for cooling the chips, and the steps approximate the linear increase of temperature of the coolant.

The explanation can be easily extended to other fin structures. for example, pin fins or offset strip fins can be tapered in the general way that FIG. 4 illustrates or the fin density could be increased in the flow direction in the general way that FIG. 5 illustrates.

The apparatus of FIG. 6

FIG. 6 shows a three by three planar array of TCM's 14 and a system for establishing a parallel flow of coolant through the fins 30 of these TCM's. As in FIGS. 1-3, the fins 30 are shown schematically without the shroud and they represent the fins of either FIG. 4 or FIG. 5. The apparatus has a different shroud structure as will be explained. The TCM's are mounted on a common TCM board 15 that is like the individual boards in FIGS. 1-3.

A local enclosure 70 holds the TCM's and the dielectric liquid coolant 20. Enclosure 70 will ordinarily be mounted in a larger enclosure that is isolated from the coolant. Several enclosures can be stacked or otherwise arranged in one larger enclosure. The local enclosure has suitable outer walls 71, 72, 73 and 74, a floor 75 and a ceiling that is not shown in the drawing. The enclosure has a coolant inlet 77 at the lower left corner and a coolant outlet 78 at the upper right corner.

The ceiling contacts the tops of the fins and thereby forms part of a shroud for each fin assembly. A system of baffles directs the coolant flow through each fin assembly in the same way as in FIGS. 4 and 5. The general flow of the coolant is diagonal across the local enclosure from lower left to upper right, and the coolant similarly flows into a module from its lower left and leaves the module at its upper right. The side walls 71, 72 and two partitions 80 and 81 form channels $83_1-85_1$ to the left and channels $83_r-85_r$ to the right of each TCM. The upstream wall 74 forms part of an inlet header 87 and the downstream wall 73 forms part of an outlet header 88. Partitions 89 block the outlet channels $83_r-85_r$ from the inlet header 87. For modules that are not adjacent to the inlet header, a diagonal baffle 90 extends from the upper left edge of one module to the lower right edge of the module above to connect the inlet end of a TCM to the left channel and the outlet end of a TCM to the outlet channel.

These components provide a parallel coolant flow through the fin assembly of each module, as arrows in the drawing show. The parallel flow can be achieved with various modifications of the walls and baffles of FIG. 6, for example by providing a separate local enclosure for each TCM. These structures can be stacked to provide a three dimensional package.

Other embodiments

The description of the preferred processing component will suggest various applications for our invention, and the specific fin assemblies of FIGS. 4 and 5 and the related discussion of heat transfer in these fin assemblies will suggest various ways to implement our new fins within the spirit of the invention and the intended scope of the claims.

What is claimed is:

1. A processing component comprising, an enclosure (12) adapted to hold a dielectric liquid coolant (20), a plurality of circuit modules (14) which each have a planar array of one or more heat producing circuit devices, a heat conducting hat spaced orthogonally from the array, and means in the module for transferring heat from the array to the hat, the array defining a plane designated X-Y and the direction from the array to the hat being designated Z, means for supporting said modules in said enclosure, and means defining a path (25, 26, 27) for circulating the coolant past the circuit modules in a predetermined direction designated X, wherein the improvement comprises, a plurality of fins (30, 52) which extend from the hat in the Z direction and define channels (54) between the fins extending generally in the X direction, whereby the coolant increases in temperature in the upstream to downstream direction along the channels, said fins being substantially equal in thickness and equal in spacing in the Y dimension, a shroud (53) which is arranged over the fins to confine the coolant to the channels, said fins being tapered in the Z dimension in the upstream to downstream direction to decrease the cross sectional area of said channels linearly in the upstream to downstream direction to thereby increase the coolant velocity in said channels and compensate for the increase in temperature of the coolant between the upstream edge and the downstream edge of the circuit module.

* * * * *

UNITED STATES PATENT AND TRADEMARK OFFICE
CERTIFICATE OF CORRECTION

PATENT NO. : 4,765,397

DATED : August 23, 1988

INVENTOR(S) : G. M. Chrysler et al

It is certified that error appears in the above-identified patent and that said Letters Patent are hereby corrected as shown below:

First Page, Section [75] Inventors:
    After "Robert E.", cancel "Simmons" and substitute -- Simons --;

Signed and Sealed this

Twenty-eighth Day of March, 1989

Attest:

DONALD J. QUIGG

Attesting Officer      Commissioner of Patents and Trademarks